(12) United States Patent
Jain et al.

(10) Patent No.: US 9,831,382 B2
(45) Date of Patent: Nov. 28, 2017

(54) EPITAXY TECHNIQUE FOR GROWING SEMICONDUCTOR COMPOUNDS

(71) Applicant: Sensor Electronic Technology, Inc., Columbia, SC (US)

(72) Inventors: Rakesh Jain, Columbia, SC (US); Wenhong Sun, Columbia, SC (US); Jinwei Yang, Columbia, SC (US); Maxim S. Shatalov, Columbia, SC (US); Alexander Dobrinsky, Providence, RI (US); Remigijus Gaska, Columbia, SC (US); Michael Shur, Latham, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 268 days.

(21) Appl. No.: 13/692,191

(22) Filed: Dec. 3, 2012

(65) Prior Publication Data
US 2014/0110754 A1    Apr. 24, 2014

Related U.S. Application Data

(60) Provisional application No. 61/566,606, filed on Dec. 3, 2011.

(51) Int. Cl.
*H01L 21/02*    (2006.01)
*H01L 29/15*    (2006.01)
(Continued)

(52) U.S. Cl.
CPC .......... *H01L 33/06* (2013.01); *H01L 21/0237* (2013.01); *H01L 21/0254* (2013.01);
(Continued)

(58) Field of Classification Search
CPC ................................. H01L 29/15; H01L 33/06
(Continued)

(56) References Cited

U.S. PATENT DOCUMENTS 5,306,924 A    4/1994 Usami et al.
5,880,491 A *  3/1999 Soref et al. .................. 257/190
(Continued)

FOREIGN PATENT DOCUMENTS

CN    101277563 A    10/2008
JP    2010153450      8/2010
(Continued)

OTHER PUBLICATIONS

Haeberlen et al., Dislocation reduction in MOVPE grown GaN layers on (111)Si using SiNx and AlGaN layers, Journal of Physics: Conference Series 209, 2010, pp. 1-4, IOP Publishing.

(Continued)

*Primary Examiner* — Lynne Gurley
*Assistant Examiner* — Vernon P Webb
(74) *Attorney, Agent, or Firm* — LaBatt, LLC (57) ABSTRACT

A solution for fabricating a semiconductor structure is provided. The semiconductor structure includes a plurality of semiconductor layers grown over a substrate using a set of epitaxial growth periods. During each epitaxial growth period, a first semiconductor layer having one of: a tensile stress or a compressive stress is grown followed by growth of a second semiconductor layer having the other of: the tensile stress or the compressive stress directly on the first semiconductor layer.

23 Claims, 11 Drawing Sheets

(51) Int. Cl.
  *H01L 33/06*  (2010.01)
  *H01L 33/00*  (2010.01)
  *H01L 33/02*  (2010.01)
(52) U.S. Cl.
  CPC .... *H01L 21/0262* (2013.01); *H01L 21/02433* (2013.01); *H01L 21/02458* (2013.01); *H01L 21/02507* (2013.01); *H01L 29/151* (2013.01); *H01L 33/007* (2013.01); *H01L 33/025* (2013.01)
(58) Field of Classification Search
  USPC .................................. 257/190–192; 438/478
  See application file for complete search history.

(56) References Cited

U.S. PATENT DOCUMENTS

| | | | |
|---|---|---|---|
| 6,472,695 | B1 | 10/2002 | Hall et al. |
| 6,518,644 | B2 | 2/2003 | Fitzgerald |
| 7,081,410 | B2 | 7/2006 | Fitzgerald |
| 7,312,474 | B2 | 12/2007 | Emerson et al. |
| 7,811,847 | B2 | 10/2010 | Hirayama et al. |
| 7,888,154 | B2 | 2/2011 | Hirayama et al. |
| 8,236,672 | B2 | 8/2012 | Chinone et al. |
| 2001/0024871 | A1* | 9/2001 | Yagi ................ C23C 16/303 438/604 |
| 2002/0005514 | A1* | 1/2002 | Fitzgerald ............ C30B 25/02 257/19 |
| 2004/0219702 | A1* | 11/2004 | Nagai et al. .................... 438/46 |
| 2005/0045895 | A1 | 3/2005 | Emerson et al. |
| 2005/0045905 | A1 | 3/2005 | Chu et al. |
| 2006/0160345 | A1 | 7/2006 | Liu et al. |
| 2007/0231488 | A1* | 10/2007 | Von Kaenel ........ C23C 16/0209 427/255.15 |
| 2008/0153191 | A1* | 6/2008 | Grillot et al. .................. 438/35 |
| 2008/0274268 | A1 | 11/2008 | Ogino |
| 2009/0057646 | A1* | 3/2009 | Hirayama ........... H01L 21/0237 257/13 |
| 2009/0200645 | A1* | 8/2009 | Kokawa et al. ............. 257/615 |
| 2009/0239357 | A1 | 9/2009 | Amano et al. |
| 2010/0230713 | A1* | 9/2010 | Minemoto .............. C30B 19/02 257/103 |
| 2010/0252834 | A1 | 10/2010 | Lee et al. |
| 2011/0037097 | A1 | 2/2011 | Scott et al. |
| 2011/0266520 | A1 | 11/2011 | Shur et al. |

FOREIGN PATENT DOCUMENTS

| | | |
|---|---|---|
| KR | 100363241 | 2/2003 |
| KR | 1020100033644 | 3/2010 |
| KR | 1020100100567 | 9/2010 |

OTHER PUBLICATIONS

Yamaguchi et al., Metalorganic vapor phase epitaxy growth of crack-free AlN on GaN and its application to high-mobility AlN/GaN superlattices, Applied Physics Letters, Nov. 2001, pp. 3062-3064, vol. 79 No. 19, American Institute of Physics.

Yamaguchi et al., Control of strain in GaN by a combination of H2 and N2 carrier gases, Journal of Applied Physics, Jun. 2001, pp. 7820-7824, vol. 89 No. 12, American Institute of Physics.

Sang et al., Reduction in threading dislocation densities in AlN epilayer by introducing a pulsed atomic-layer epitaxial buffer layer, Applied Physics Letters, 2008, pp. 122104-1-122104-3, American Institute of Physics.

Reentila et al., Effect of the AlN nucleation layer growth on AlN material quality, Journal of Crystal Growth, 2008, pp. 4932-4934, Elsevier B.V.

Ponchet et al., Lateral modulations in zeronetstrained GaInAsP multilayers grown by gas source molecularbeam epitaxy, Journal of Applied Physics, 1993, pp. 3778-3782, American Institute of Physics.

Okada et al., Growth of high-quality and crack free AlN layers on sapphire substrate by multi-growth mode modification, Journal of Crystal Growth, 2007, pp. 349-353, Elsevier B.V..

Morkoc, Thermal Mismatch Induced Strain, Handbook of Nitride Semiconductors and Devices, 2008, pp. 290-292, vol. 1, Wiley-VCH Verlag GmbH & Co. KGaA.

Ohba et al., Growth of AlN on sapphire substrates by using a thin AlN bu!er layer grown two-dimensionally at a very low V/III ratio, Journal of Crystal Growth, 2000, pp. 258-261, Elsevier Science B.V..

Mitrofanov et al., High quality UV AlGaN/AlGaN distributed Bragg reflectors and microcavities, Gallium Nitride Materials and Devices II, 2007, pp. 64731G-1-64731G-5, vol. 6473, SPIE.

Zhang et al., Growth of Highly Conductive n-Type Al0:7Ga0:3N Film by Using AlN Buffer with Periodical Variation of V/III Ratio, Chinese Phys. Lett., 2008, pp. 4449-4452, vol. 25 No. 12, Chinese Physical Society and IOP Publishing Ltd.

Imura, et al., High-Temperature Metal-Organic Vapor Phase Epitaxial Growth of AlN on Sapphire by Multi Transition Growth Mode Method Varying V/III Ratio, Japanese Journal of Applied Physics, 2006, pp. 8639-8643, vol. 45 No. 11, The Japan Society of Applied Physics.

Hsu et al., Growth and characteristics of self-assembly defect-free GaN surface islands by molecular beam epitaxy., Apr. 2011, 1 page, J Nanosci Nanotechnol.

Figge et al., In situ and ex situ evaluation of the film coalescence for GaN growth on GaN nucleation layers, Journal of Crystal Growth, 2000, pp. 262-266, Elsevier Science B.V..

Dridi et al., First-principles investigation of lattice constants and bowing parameters in wurtzite AlxGa1-xN, InxGa1-xN and InxAl1-xN alloys, Semiconductor Science and Technology, 2003, pp. 850-856, Institute of Physics Publishing.

Dimitrakopulos et al., Strain accommodation and interfacial structure of AlN interlayers in GaN, Cryst. Res. Technol., 2009, pp. 1170-1180, No. 10, Wiley-VCH Verlag GmbH & Co. KGaA, Weinheim.

Zhang et al., Improvement of AlN Film Quality by Controlling the Coalescence of Nucleation Islands in Plasma-Assisted Molecular Beam Epitaxy, Chinese Phys. Lett., 2010, pp. 058101-1-058101-3, vol. 27 No. 5, Chinese Physical Society and IOP Publishing Ltd.

Acord et al., In situ stress measurements during MOCVD growth of AlGaN on SiC, Journal of Crystal Growth, 2004, pp. 65-71, Elsevier B.V..

Yoshikawa et al., A New "Three-Step Method" for High Quality MOVPE Growth of III-Nitrideson Sapphire, phys. stat. sol., 2001, pp. 625-628, No. 2, Wiley-VCH Verlag Berlin GmbH.

Hirayama et al., 231-261nm AlGaN deep-ultraviolet light-emitting diodes fabricated on AlN multilayer buffers grown by ammonia pulse-flow method on sapphire, Applied Physics Letters, 2007, pp. 071901-1-071901-3, American Institute of Physics.

Zhang et al., Pulsed atomic layer epitaxy of quaternary AlInGaN layers, Applied Physics Letters, Aug. 2001, pp. 925-927, vol. 79 No. 7, American Institute of Physics.

Zhang et al., Crack-free thick AlGaN grown on sapphire using AlN/AlGaN superlattices for strain management, Applied Physics Letters, May 2002, pp. 3542-3544, vol. 80 No. 19, American Institute of Physics.

Nishinaga et al., Epitaxial Lateral Overgrowth of GaAs by LPE, Japanese Journal of Applied Physics, Jun. 1988, pp. L964-L967, vol. 27 No. 6.

Bai et al., Reduction of threading dislocation densities in AlN/sapphire epilayers driven by growth mode modification, Applied Physics Letters, 2006, pp. 051903-1-051903-3, American Institute of Physics.

Choi, International Search Report and Written Opinion for International Application No. PCT/US2012/067590, dated Mar. 26, 2013, 11 pages.

Choi, International Search Report and Written Opinion for International Application No. PCT/US2013/024310, dated May 15, 2013, 9 pages.

Office Action for Application No. 13756806, dated Dec. 9, 2014 with 28 pages.

(56) References Cited

OTHER PUBLICATIONS

Allen, E., U.S. Appl. No. 13/756,806, Final Office Action 1, dated Sep. 1, 2015, 38 pages.
Akasheh et al., "Multiscale Modeling and Simulation of Deformation in Nanoscale Metallic Multilayered Composites," Chapter 6 of Kwon et al., "Multiscale Modeling and Simulation of Composite Materials and Structures," Spring, New York, 2008.
Mathis, et al., "Modeling of threading dislocation reduction in growing GaN layers," Journal of Crystal Growth 231 (2001), pp. 371-390.
Jinzhu, C., Application No. 201380013532.2, Rejection Decision (with English translation), dated Apr. 13, 2017, 10 pages (received Apr. 26, 2017).
Picardat, K., U.S. Appl. No. 15/391,922, Non-Final Office Action 1, dated Jun. 16, 2017, 20 pages.
Jinzhu, C., Application No. 201380013532.2, Office Action—English translation, dated Apr. 7, 2016, 6 pages.
Allen, E., U.S Appl. No. 13/756,806, Final Office Action 2, dated Jan. 4, 2017, 25 pages.
Allen E., U.S. Appl. No. 13/756,806, Non-Final Office Action 2, dated May 5, 2016, 23 pgs.
Jinzhu, C., Application No. 201380013532.2, Office Action2—English translation, dated Dec. 2, 2016, 15 pages.

\* cited by examiner

EPITAXY TECHNIQUE FOR GROWING SEMICONDUCTOR COMPOUNDS

REFERENCE TO RELATED APPLICATIONS

The current application claims the benefit of U.S. Provisional Application No. 61/566,606, titled "Epitaxy Technique for Growing Low Stress Nitride-Based Semiconductor Compounds," which was filed on 3 Dec. 2012, and which is hereby incorporated by reference.

GOVERNMENT LICENSE RIGHTS

This invention was made with government support under contract no. W911 NF-10-2-0023 awarded by the Defense Advanced Research Projects Agency (DARPA). The government has certain rights in the invention.

TECHNICAL FIELD

The disclosure relates generally to growing semiconductor compounds, and more particularly, to an epitaxy technique for such growth, which can result in a low stress compound.

BACKGROUND ART

For light emitting devices, such as light emitting diodes (LEDs) and especially deep ultraviolet LEDs (DUV LEDs), minimizing a dislocation density and a number of cracks in the semiconductor layers increases the efficiency of the device. To this extent, several approaches have sought to grow low-defect semiconductor layers on patterned substrates. These approaches typically rely on reducing stresses present in epitaxially grown semiconductor layers.

For example, one approach to reduce stress accumulation in an epitaxially grown layer relies on patterning the underlying substrate using microchannel epitaxy (MCE). Using MCE, a narrow channel is used as a nucleation center containing low defect information from the substrate. An opening in a mask acts as a microchannel, which transfers crystal information to the overgrown layer, while the mask prevents dislocations from transferring to the overgrown layer. As a result, the overgrown layer can become dislocation free. The three-dimensional structure of the MCE also provides another advantage to stress release. The residual stress can be released effectively since the overgrown layer easily deforms. In another approach, a mask is applied at a location of a large concentration of dislocation densities to block their further propagation.

Figure 1A:
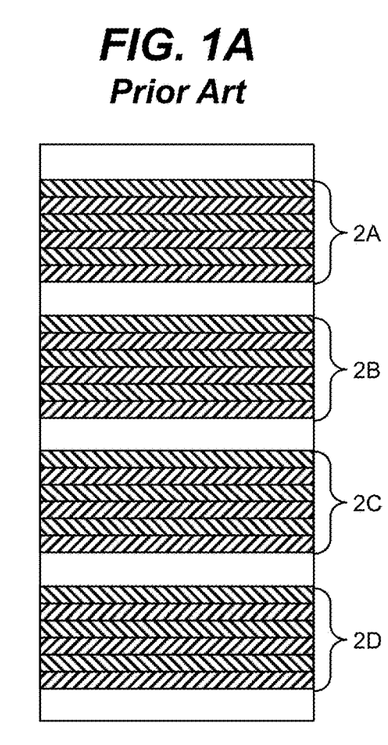
FIGS. 1A-1C show approaches for reducing dislocation density according to the prior art.

Other approaches rely on epitaxially growing a group III nitride based semiconductor superlattice. The superlattice structure mitigates the strain difference between an aluminum nitride (AlN)/sapphire template and the subsequent thick $Al_xGa_{1-x}N$ (where $0 \leq x \leq 1$) layers. For devices such as DUV LEDs, thick AlGaN epitaxial layers (e.g., of the order of a few micrometers) are desirable to reduce current crowding. Using a superlattice approach, an AlN/AlGaN superlattice was grown to reduce biaxial tensile strain and a 3.0-μm-thick $Al_{0.2}Ga_{0.8}N$ was grown on sapphire without any cracks. Similarly, a superlattice structure shown in FIG. 1A can comprise a periodic structure with each element 2A-2D composed of alternating sublayers of semiconductor materials with different polarizations and different accumulated stresses in the sublayers. Such a superlattice can be used to minimize the dislocation density due to varying stresses in the sublayers of the superlattice elements.

Figure 1B:
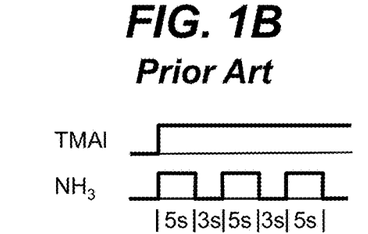
Figure 1C:
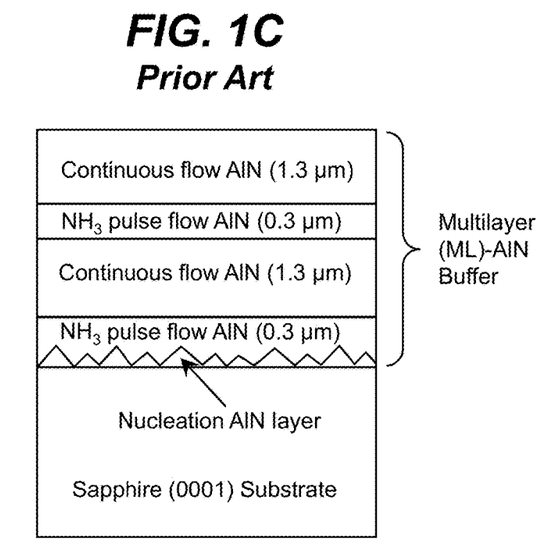

While the superlattice approaches allow some control of tensile and compressive stresses in epitaxially grown nitride semiconductor layers, the approaches do not enable epitaxial growth of nitride based semiconductor layers with uniform composition. To grow such layers, variation of nitrogen and aluminum vacancies has been explored. For example, FIGS. 1B and 1C illustrate one approach for fabricating AlN multilayer buffers according to the prior art. In particular, FIG. 1B shows the gas flow sequence used for $NH_3$ pulse-flow growth, while FIG. 1C shows a schematic structure of the AlN buffer. In a first step, an AlN nucleation layer and an initial AlN layer are deposited using $NH_3$ pulse-flow growth. A low threading dislocation density was achieved by a coalescence process of the AlN nucleation layer. For example, as observed from a cross-sectional transmission electron microscope (TEM) image, edge-type and screw-type dislocation densities of an AlGaN layer on an AlN buffer layer were reported as $3.2 \times 10^9$ and $3.5 \times 10^8$ $cm^{-2}$, respectively.

SUMMARY OF THE INVENTION

Aspects of the invention provide a solution for fabricating a semiconductor structure. The semiconductor structure includes a plurality of semiconductor layers grown over a substrate using a set of epitaxial growth periods. During each epitaxial growth period, a first semiconductor layer having one of: a tensile stress or a compressive stress is grown followed by growth of a second semiconductor layer having the other of: the tensile stress or the compressive stress directly on the first semiconductor layer. In this manner, the overall residual stress for the plurality of semiconductor layers can be approximately zero, which can result in the semiconductor structure having a reduced number of cracks and/or threading dislocations than prior art approaches.

A first aspect of the invention provides a method of fabricating a semiconductor structure, the method comprising: growing a plurality of semiconductor layers over a substrate using a set of epitaxial growth periods, wherein each epitaxial growth period includes: epitaxially growing a first semiconductor layer having one of: a tensile stress or a compressive stress; and epitaxially growing a second semiconductor layer having the other of: the tensile stress or the compressive stress directly on the first semiconductor layer.

A second aspect of the invention provides a semiconductor structure including: a substrate; and a plurality of semiconductor layers on the substrate, the plurality of semiconductor layers including a set of periods, each period including: a first semiconductor layer, wherein the first semiconductor layer has one of: a tensile stress or a compressive stress; and a second semiconductor layer directly on the first semiconductor layer, wherein the second semiconductor layer has the other of: the tensile stress or the compressive stress.

A third aspect of the invention provides a method of fabricating a semiconductor structure, the method comprising: growing a plurality of group III nitride semiconductor layers over a substrate using a set of epitaxial growth periods, wherein each epitaxial growth period includes: epitaxially growing a first group III nitride semiconductor layer having one of: a tensile stress or a compressive stress; and epitaxially growing a second group III nitride semiconductor layer having the other of: the tensile stress or the compressive stress directly on the first semiconductor layer, wherein the epitaxially growing the first semiconductor layer and the epitaxially growing the second semiconductor layer use molar ratios of group V precursors to group III precursors that differ by at least ten percent.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a solution for fabricating a semiconductor structure. The semiconductor structure includes a plurality of semiconductor layers grown over a substrate using a set of epitaxial growth periods. During each epitaxial growth period, a first semiconductor layer having one of: a tensile stress or a compressive stress is grown followed by growth of a second semiconductor layer having the other of: the tensile stress or the compressive stress directly on the first semiconductor layer. In this manner, the overall residual stress for the plurality of semiconductor layers can be approximately zero, which can result in the semiconductor structure having a reduced number of cracks and/or threading dislocations than prior art approaches. As used herein, unless otherwise noted, the term "set" means one or more (i.e., at least one) and the phrase "any solution" means any now known or later developed solution.

Aspects of the invention are directed to the growth of semiconductor layers on a substrate. In an embodiment, the semiconductor layers are formed of elements selected from the group III-V materials system. In a more particular embodiment, the semiconductor layers are formed of group III nitride materials. Group III nitride materials comprise one or more group III elements (e.g., boron (B), aluminum (Al), gallium (Ga), and indium (In)) and nitrogen (N), such that $B_W Al_X Ga_Y In_Z N$, where $0 \le W, X, Y, Z \le 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements.

The substrate can comprise any type of substrate exhibiting a lattice mismatch with the semiconductor layer grown thereon. To this extent, the substrate can have a lattice constant that is different from a lattice constant corresponding to one of the semiconductor layers epitaxially grown thereon. As used herein, a substrate is lattice mismatched with a semiconductor layer when the lattice constants differ by more than one percent (e.g., as calculated by the lattice constant of the semiconductor layer minus the lattice constant of the substrate divided by the lattice constant of the semiconductor layer). In an embodiment, the substrate is an insulating material, such as sapphire or silicon carbide (SiC). However, the substrate can comprise any suitable material, such as silicon (Si), a nitride substrate (e.g., AlN, GaN, BN, AlGaN, and/or the like), an oxide substrate (e.g., aluminum oxynitride, zinc oxide (ZnO), lithium gallate ($LiGaO_2$), lithium aluminate ($LiAlO_2$), magnesium aluminate ($MgAl_2O_4$), scandium magnesium aluminum oxide ($ScMgAlO_4$), and/or the like), and/or other related materials.

The layer(s) grown as described herein can be implemented as part of any type of semiconductor device. In an embodiment, the semiconductor device is an emitting device. In a more particular embodiment, the emitting device is configured to operate as a light emitting diode (LED), such as a conventional or super luminescent LED. Similarly, the emitting device can be configured to operate as a laser, such as a laser diode (LD). In another embodiment, the semiconductor device is configured to operate as a photodetector, photomultiplier, and/or the like. Regardless, electromagnetic radiation emitted or detected by the device can comprise a peak wavelength within any range of wavelengths, including visible light, ultraviolet radiation, deep ultraviolet radiation, infrared light, and/or the like.

Aspects of the invention utilize an ability to selectively grow a layer exhibiting either tensile or compressive residual stress depending on the deposition conditions. For example, a change in a set of the deposition conditions for growing an aluminum nitride (AlN) epitaxial layer on a foreign substrate can result in the layer exhibiting either tensile or compressive residual stress. In an embodiment, the set of deposition conditions includes a molar ratio of group V precursors to group III precursors (V/III ratio), which can be altered during the growth of a group III-V semiconductor layer.

Figure 2:
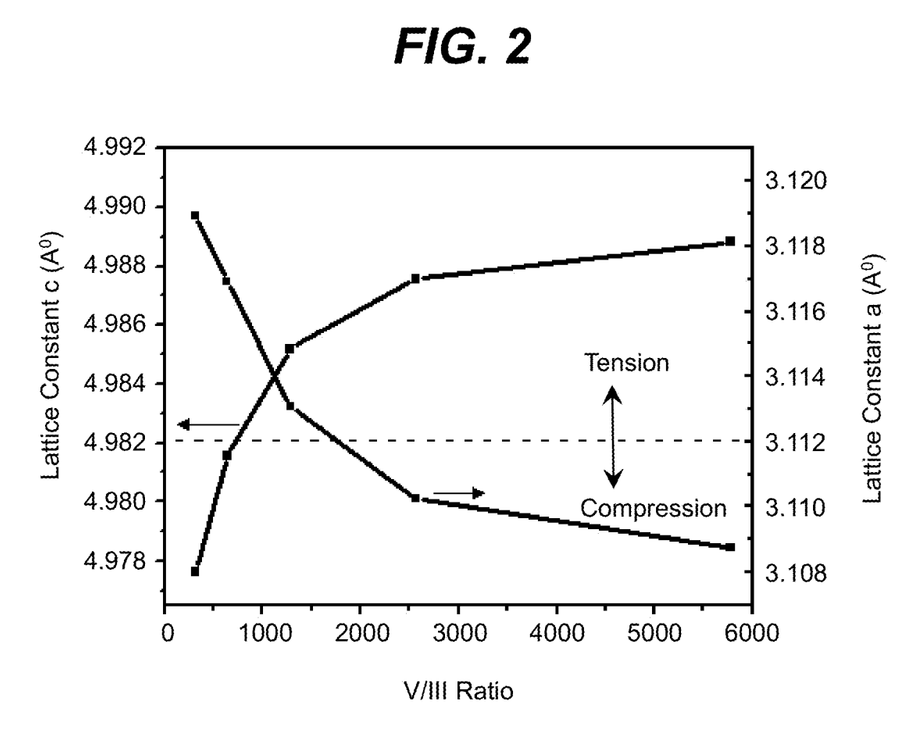
FIG. 2 shows illustrative plots of the lattice constants a and c as a function of the V/III ratio for an AlN layer according to an embodiment.

To this extent, FIG. 2 shows illustrative plots of the lattice constants a and c as a function of the V/III ratio for an AlN layer according to an embodiment. Different lattice directions can result in different tensile and compressive properties for the AlN layer. For example, for a low V/III ratio (e.g., less than approximately 1800), the lattice constant a for the AlN layer is slightly larger than the lattice constant a for an AlN layer without the presence of point defects (e.g., approximately 3.112). The difference in the lattice constant a results in tensile stresses being accumulated in the layer. For a high V/III ratio (e.g., greater than approximately 1800), the lattice constant a for the AlN layer is slightly smaller than the lattice constant a for an AlN layer without the presence of point defects, which results in compressive stresses being accumulated in the layer. The V/III ratio also influences the lattice constant c. In this case, small values of the V/III ratio (e.g., below approximately 750) result in a lattice constant c, which causes compressive stress (e.g., is below approximately 4.982) in the layer, while larger values of the V/III ratio (e.g., above approximately 750) result in a lattice constant c, which causes tensile stress in the layer.

Figure 3:
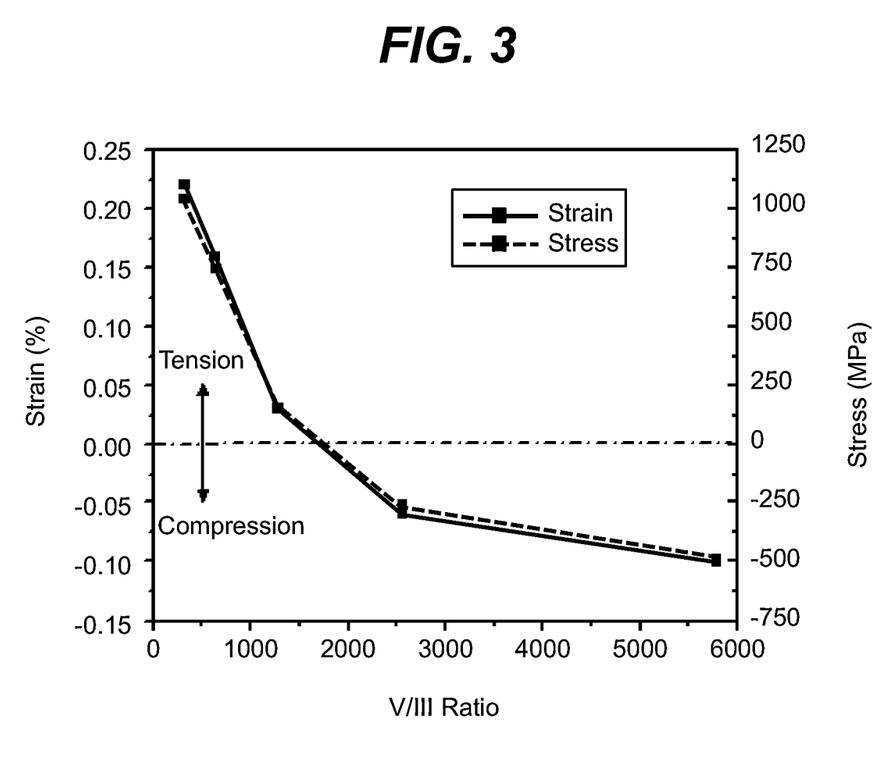
FIG. 3 shows illustrative plots of stress and strain as a function of the V/III ratio for an AlN layer according to an embodiment.

FIG. 3 shows illustrative plots of stress and strain as a function of the V/III ratio for an AlN layer according to an embodiment. As illustrated, an AlN layer grown under a low V/III ratio (e.g., less than approximately 1800) is in tensile stress, while an AlN layer grown with a high V/III ratio (e.g., above approximately 1800) is in compressive stress. As further illustrated, only small changes in the strain of the AlN layer are produced by modulating the V/III ratio.

In an embodiment, growth of a semiconductor heterostructure (e.g., a layer), such as a group III-V based heterostructure, includes growth of a series of layers (e.g., films) with alternating tensile and compressive stresses. A layer can be selectively configured to have tensile or compressive stress by modulating a V/III ratio in each layer. For example, the modulation can include varying the V/III ratio according to a set schedule to yield compressive and tensile semiconductor layers. Additionally, one or more additional deposition conditions can be changed, such as a growth temperature, a gas flow, and/or the like. Furthermore, one or more attributes of the layers, such as a relative thickness of a layer, a distribution of stress within each layer, and/or the like, can be adjusted during the growth of the layer. The modulation of the set of deposition conditions can result in regions of increased compressive stresses and regions of increased tensile stress. In this manner, the resulting semiconductor structure can be configured to have a condition of approximately zero (or near zero) overall residual stress.

Figure 4A:
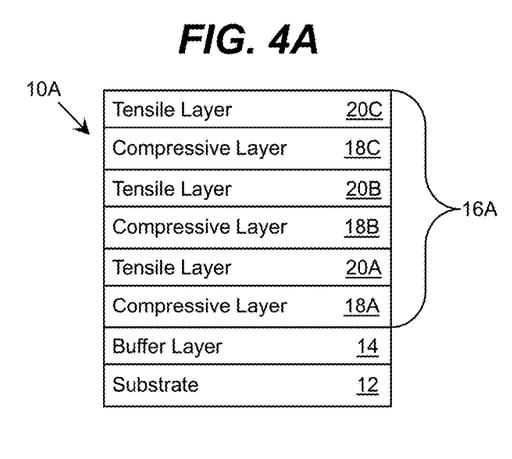
FIGS. 4A-4C show illustrative structures according to embodiments.
Figure 4B:
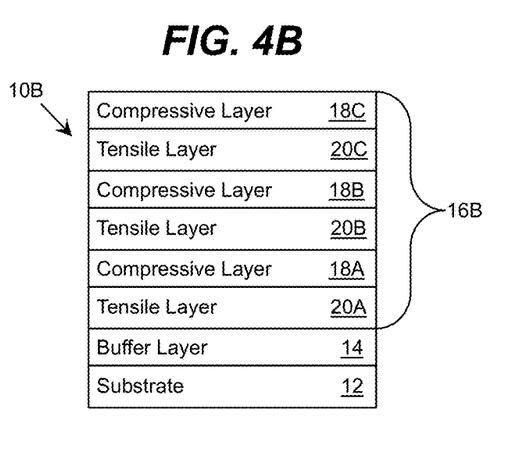
Figure 4C:
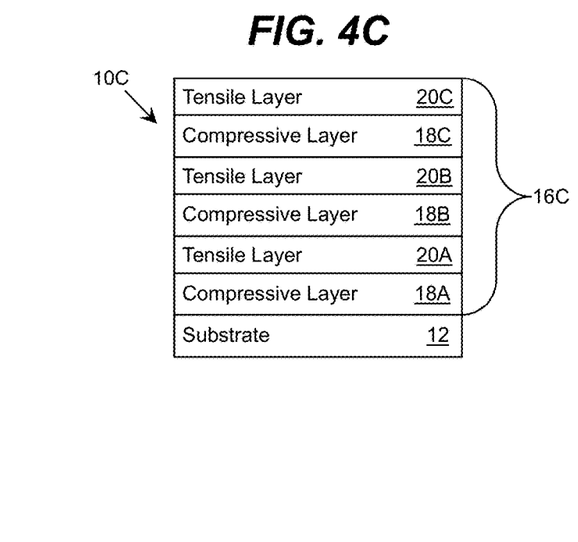

FIGS. 4A-4C show illustrative structures 10A-10C according to embodiments. Each structure 10A-10C includes a substrate 12, which can be a foreign substrate, such as sapphire, SiC, or the like. Furthermore, the structures 10A, 10B include a buffer layer 14 (e.g., a nucleation layer) grown directly on the substrate 12. The buffer layer 14 can provide a transition to accommodate a large lattice mismatch between the substrate 12 and the subsequent semiconductor heterostructure 16A-16C. In an embodiment, the buffer layer 14 can comprise an $Al_xGa_{1-x}N/Al_yGa_{1-y}N$ superlattice, where $0 \leq x, y \leq 1$. Each superlattice layer can be, for example, up to several nanometers thick. In an embodiment, the layers with differing aluminum content (e.g., denoted by x and y) can have similar thicknesses. In an illustrative embodiment, the buffer layer 14 has a thickness in a range from nearly zero nanometers to approximately 2000 nanometers. In another embodiment, growth of the buffer layer 14 uses a growth temperature between approximately 500 and approximately 1200 degrees Celsius and a growth rate between approximately 0.01 micrometers and approximately 10 micrometers per hour. However, as illustrated by the structure 10C, embodiments of the structure can be formed without the buffer layer 14, e.g., based on the material of the substrate and/or the corresponding lattice mismatch.

Regardless, each of the structures 10A-10C includes a semiconductor heterostructure 16A-16C grown on the substrate 12. Each semiconductor heterostructure 16A-16C is formed of a plurality of compressive layers 18A-18C alternating with a plurality of tensile layers 20A-20C. In the structures 10A, 10C, a compressive layer 18A is first grown, while in the structure 10B, a tensile layer 20A is first grown.

While each semiconductor heterostructure 16A-16C is shown including three periods of epitaxial growth (e.g., each period including a compressive and a tensile layer), it is understood that a semiconductor heterostructure can include any number of periods. In an embodiment, the stress changes abruptly between a compressive layer and the adjacent tensile layer. Alternatively, the stress can gradually change between adjacent layers (e.g., by growing layers having a graded tensile or compressive stress). Furthermore, the tensile and compressive stress can be substantially constant between periods of the semiconductor heterostructure 16A-16C or can gradually change from period to period.

The growth of a semiconductor heterostructure 16A-16C, and the growth of the corresponding layers 18A-18C, 20A-20C forming the semiconductor heterostructure 16A-16C, can use any set of deposition conditions. For example, the set of deposition conditions for a layer 18A-18C, 20A-20C can include: a group III precursor flow rate between approximately 0.1 and approximately 200 micromoles per minute; a nitrogen precursor flow rate between approximately 100 and 10000 standard cubic centimeters per minute (SCCM); a pressure between approximately 1 and 760 Torr; a molar ratio of group V precursors to group III precursors (V/III ratio) between approximately 10 and approximately 1000; and a growth temperature between approximately 500 and approximately 1800 degrees Celsius. Furthermore, a layer 18A-18C, 20A-20C can be grown to a thickness that is greater than a critical thickness to avoid pseudomorphic growth. In an embodiment, each layer 18A-18C, 20A-20C has a thickness between approximately one nanometer and five micrometers.

As described herein, during the growth of a semiconductor heterostructure 16A-16C, one or more of a set of the deposition conditions for epitaxially growing a layer 18A-18C, 20A-20C can be changed to cause the resulting layer 18A-18C, 20A-20C to exhibit either tensile or compressive residual stress. For example, the growth of a compressive layer and the growth of a tensile layer can use molar ratios of group V precursors to group III precursors that differ by at least ten percent. In an embodiment, a composition of the compressive layer differs from a composition of the tensile layer by no more than approximately five percent. For example, a fraction of aluminum in the tensile layer can differ from a fraction of aluminum in the compressive layer by no more than approximately five percent. Similarly, the compressive and tensile layers can have a lattice mismatch of at least 0.0001 Angstroms. Furthermore, a growth rate for the compressive and tensile layers can be changed. In an embodiment, the growth rates for the compressive and tensile layers differ by at least ten percent. A growth temperature for the compressive and tensile layers can be substantially the same or changed. In an embodiment, the growth temperatures for the compressive and tensile layers differ by at least two percent.

Figure 5A:
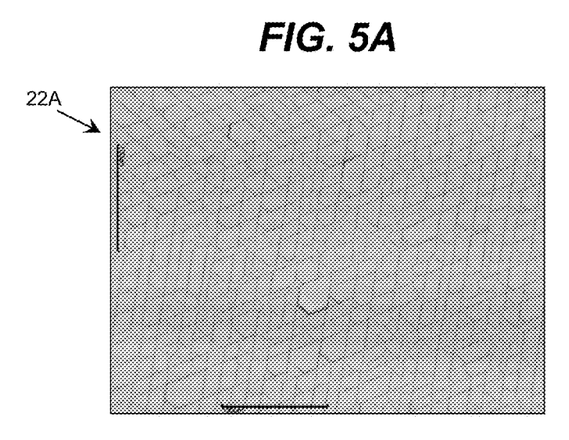
FIGS. 5A and 5B show illustrative bright field optical microscope images of layers according to an embodiment.
Figure 5B:
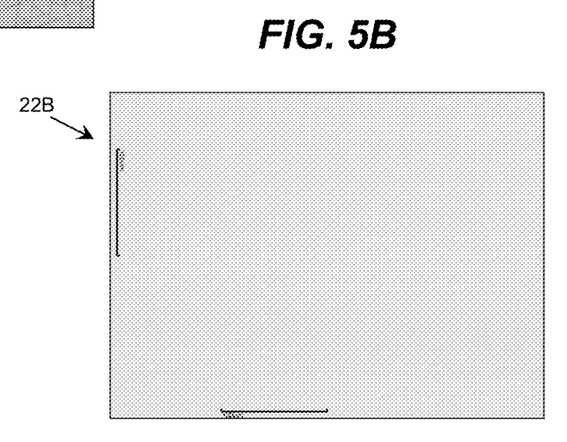

Dislocation density of a layer can be analyzed using bright field optical microscope images. To this extent, FIGS. 5A and 5B show illustrative bright field optical microscope images 22A, 22B of layers according to an embodiment. In FIG. 5A, the image 22A corresponds to a layer grown without any strain modulation described herein. As illustrated, the layer includes various micro-cracks. In FIG. 5B, the image 22B corresponds to a layer grown using strain modulation described herein. As illustrated, the layer shown in the image 22B has a significant reduction in the number of cracks, and is substantially crack-free. In each image 22A, 22B, the black bars indicate a distance of one hundred micrometers.

Figure 6:
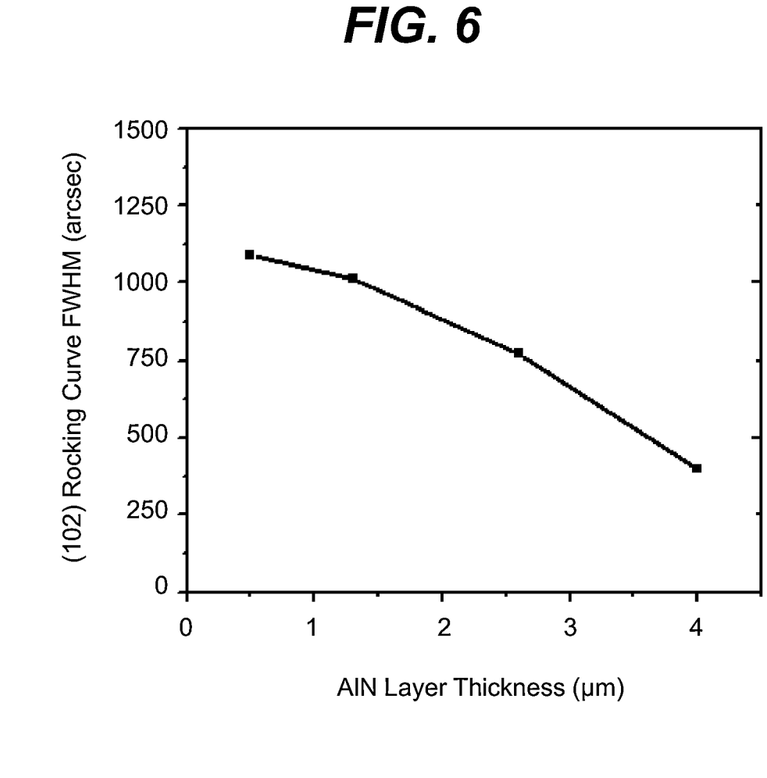
FIG. 6 shows an illustrative plot of a (102) XRD rocking curve FWHM as a function of layer thickness according to an embodiment.

Additionally, analysis of the dislocation density of a layer can include analysis of an X-ray diffraction (XRD) rocking curve, where the full width at half minimum (FWHM) of (102) reflection is related to the dislocation density. To this extent, FIG. 6 shows an illustrative plot of a (102) XRD rocking curve FWHM as a function of layer thickness according to an embodiment. The plot corresponds to an AlN layer grown using strain modulation as described herein. As a illustrated, the AlN (102) XRD rocking curve FWHM is reduced as the layer thickness increases, which indicates a reduction in a density of the edge dislocations.

Figure 7:
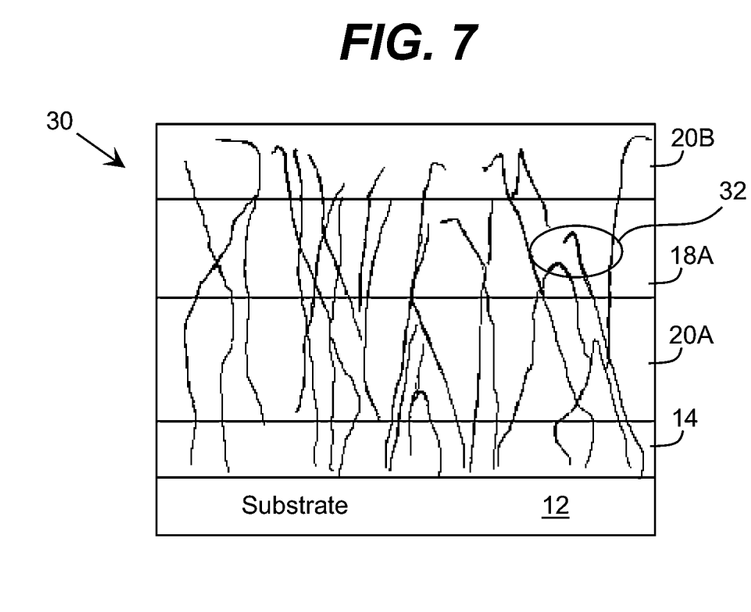
FIG. 7 shows a possible mechanism for the reduction of dislocation density provided by a growth procedure described herein.

FIG. 7 shows a possible mechanism for the reduction of dislocation density provided by a growth procedure described herein. As illustrated, the structure 30 includes a substrate 12, a buffer layer 14, a layer 20A having a tensile stress, a layer 18A having a compressive stress, and a layer 20B having a tensile stress. A series of dislocations can propagate from the substrate 12 into the upper layers. However, as the dislocations propagate, some or all of the dislocations will tend to bend, such as shown in the region 32, due to the tensile and compressive stresses. As a result, a number of threading dislocations present in the upper regions of the structure 30, e.g., in layer 20B, can be significantly reduced from the number propagating from the substrate 12.

In an embodiment, a surface of one or more layers can be patterned, which can be configured to provide an additional relaxation mechanism for reducing cracks and/or threading dislocations in a structure. For example, a surface of the substrate 12 and/or the buffer layer 14 can be patterned, e.g., using etching, masking, a combination of etching and masking, and/or the like. A layer, such as the buffer layer 14 and/or any layer located above the buffer layer, can be grown in multiple steps, one or more of which can include patterning. Such patterning can be achieved by etching and/or masking the layer, masking and subsequent overgrowth, by producing voids during overgrowth process, and/or the like. Regardless, the patterning can be configured to reduce an overall stress accumulated in the corresponding layer structure.

Figure 8A:
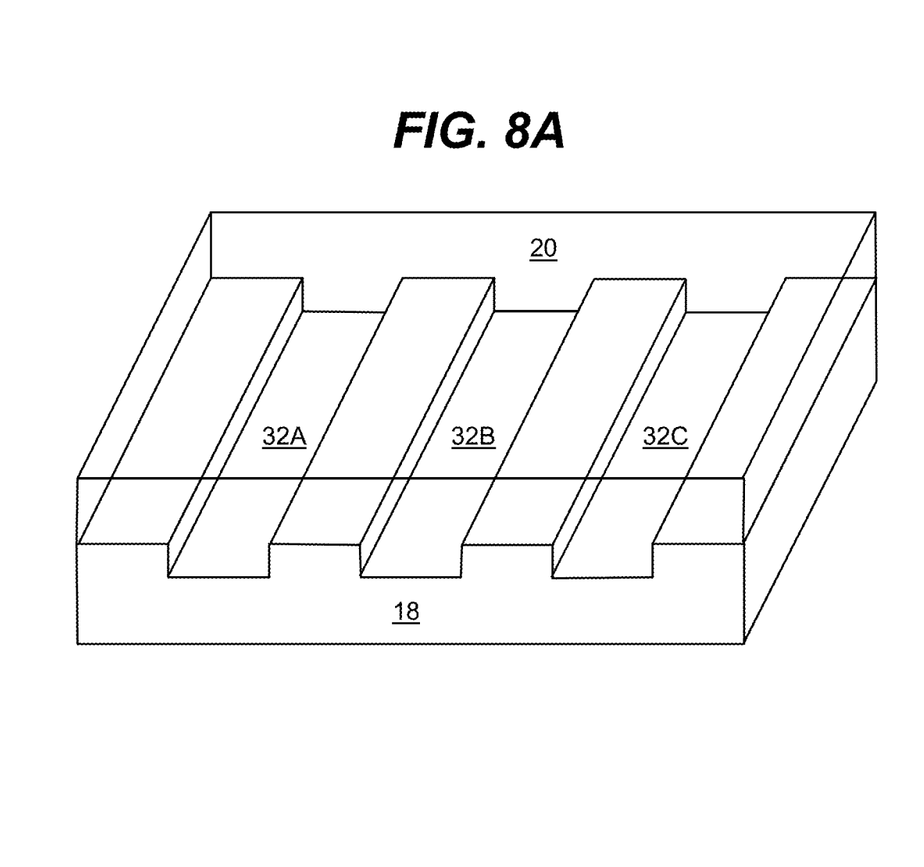
FIGS. 8A and 8B show illustrative patterns of a surface of a compressive layer with a tensile layer grown thereon according to embodiments.
Figure 8B:
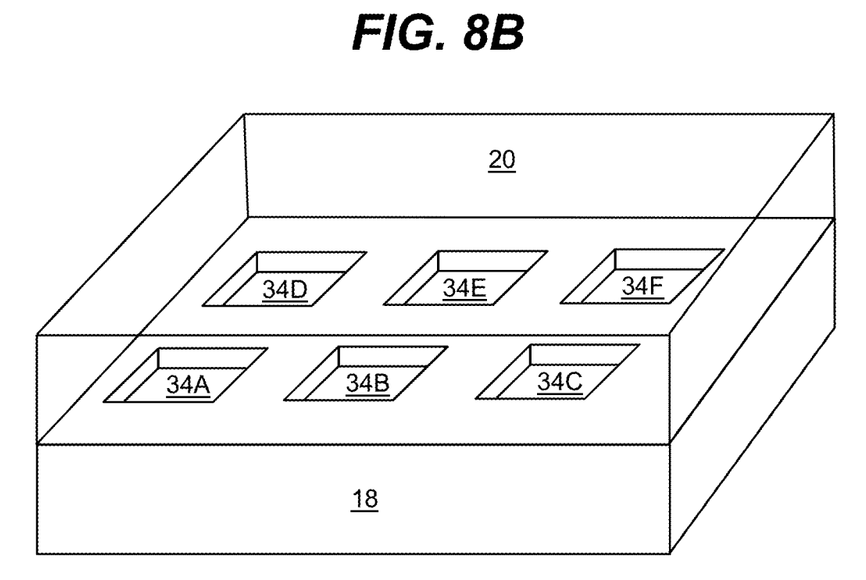

For example, FIGS. 8A and 8B show illustrative patterns of a surface of a compressive layer 18 with a tensile layer 20 grown thereon according to embodiments. In FIG. 8A, the surface of the compressive layer 18 is patterned with a plurality of stripes 32A-32C, while in FIG. 8B, the surface of the compressive layer 18 is patterned with a plurality of windows 34A-34F. However, it is understood that the stripe/window patterns are only illustrative of various patterns that can be utilized. Furthermore, it is understood that similar patterns can be formed on a surface of a substrate 12, a buffer layer 14, and/or a tensile layer 20 prior to the growth of a subsequent layer thereon. Regardless, each pattern can produce an interface where the layers 18, 20 have a common boundary in both a vertical direction of growth and in a lateral direction of the layer.

Figure 9A:
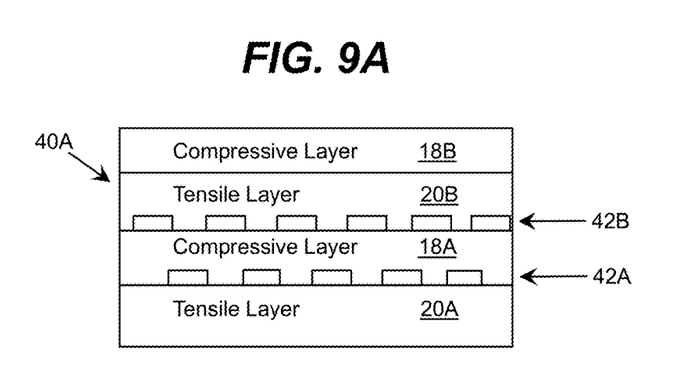
FIGS. 9A and 9B show illustrative patterning arrangements according to embodiments.
Figure 9B:
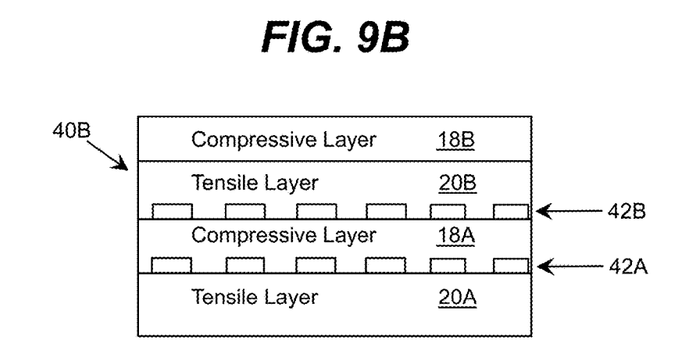

When patterning is employed on the surfaces of multiple layers, the relative positioning of the patterning elements and/or the patterns can be varied for the surfaces of adjacent patterned layers. For example, FIGS. 9A and 9B show illustrative patterning arrangements according to embodiments. In FIGS. 9A and 9B, an interface between a tensile layer 20A and a compressive layer 18A has a first pattern 42A, and an interface between the compressive layer 18A and a tensile layer 20B has a second pattern 42B. The patterns 42A, 42B can be formed by plurality of patterning elements, for example, a series of masked domains or voids located at the respective interfaces. However, in the structure 40A, the patterning elements of the patterns 42A, 42B are laterally offset from one another, thereby forming a vertical checkerboard-like formation of the patterning elements. In contrast, in the structure 40B, the patterning elements of the patterns 42A, 42B are positioned at substantially the same lateral locations.

It is understood that a device or a heterostructure used in forming a device including a structure described herein can be fabricated using any solution. For example, a device/heterostructure can be manufactured by obtaining (e.g., forming, preparing, acquiring, and/or the like) a substrate 12, forming (e.g., growing) a buffer layer 14 thereon, and growing a semiconductor heterostructure 16 as described herein. Furthermore, the fabrication can include patterning a surface of the substrate 12, the buffer layer 14, and/or a semiconductor layer as described herein, the deposition and removal of a temporary layer, such as mask layer, the formation of one or more additional layers not shown, and/or the like. Additionally, one or more metal layers, contacts, and/or the like can be formed using any solution. The heterostructure/device also can be attached to a submount via contact pads using any solution.

The patterning of a layer can be performed using any solution. For example, the patterning can include defining a set of regions on a top surface of the layer for etching using, for example, photolithography to apply a photoresist defining the set of regions, or the like. The set of openings having a desired pattern can be formed, e.g., by etching in the set of defined regions of the layer. Subsequently, the photoresist can be removed from the surface. Such a process can be repeated one or more times to form a complete pattern on the layer. The patterning of a layer also can include applying (e.g., depositing) a mask (e.g., silicon dioxide, a carbon based material, or the like) over a second set of regions on the top surface of the layer. When the pattern also includes a set of openings, the second set of regions can be entirely distinct from the locations of the set of openings. Furthermore, as described herein, the formation of a layer can include multiple repetitions of the patterning process. In this case, each repetition can vary from the previous repetition in one or more aspects. For example, a repetition can include both applying a mask and forming openings on a surface, only forming openings, only applying a mask, and/or the like. Additionally, as described herein, the locations of the masked and/or opening portions for a repetition can be vertically offset from the locations of the adjacent repetition.

Figure 10:
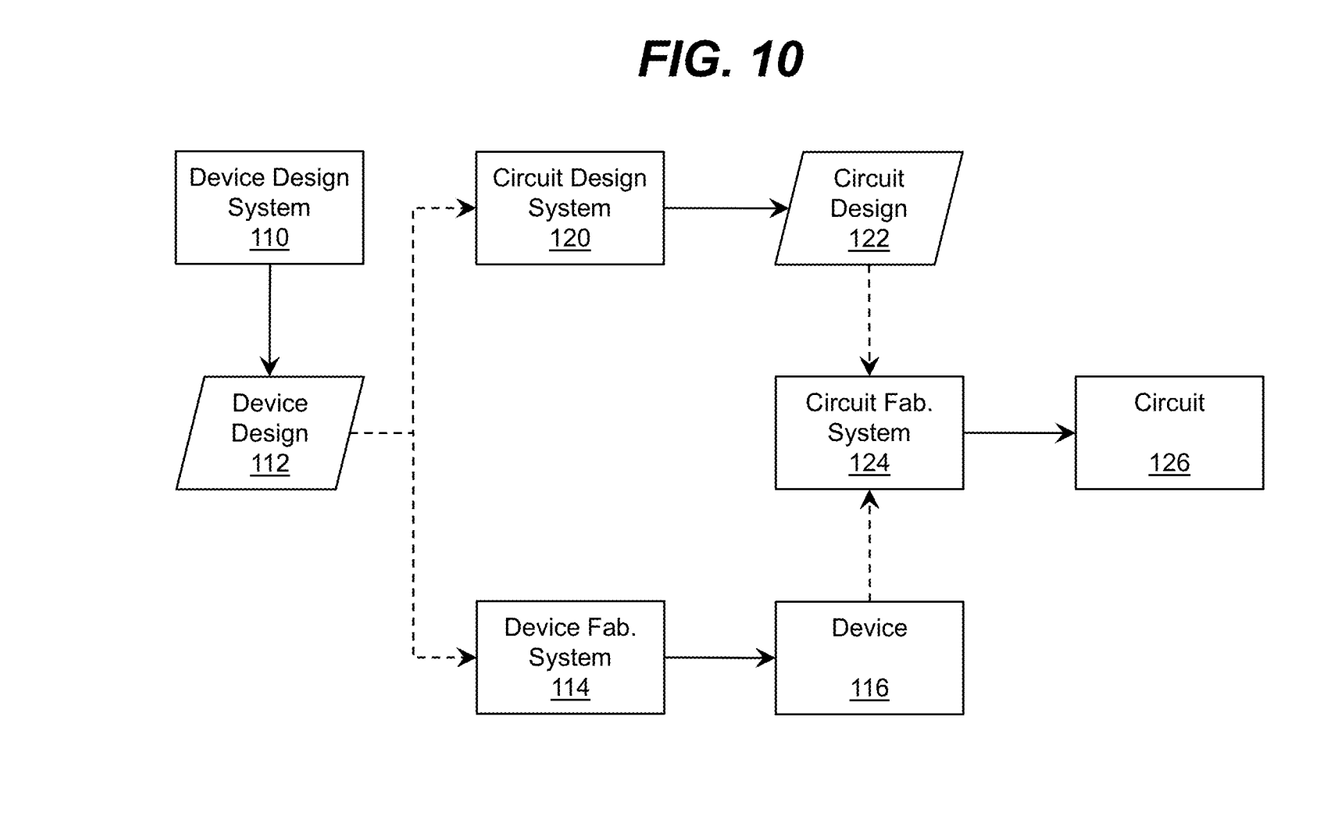
FIG. 10 shows an illustrative flow diagram for fabricating a circuit according to an embodiment.

In an embodiment, the invention provides a method of designing and/or fabricating a circuit that includes one or more of the devices designed and fabricated as described herein. To this extent, FIG. 10 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method of fabricating a semiconductor structure, the method comprising:
    growing a plurality of semiconductor layers over a substrate using a set of epitaxial growth periods, wherein each epitaxial growth period includes:
        epitaxially growing a first semiconductor layer having a tensile stress using a first molar ratio of group V precursors to group III precursors (first V/III ratio); and
        epitaxially growing a second semiconductor layer having a compressive stress using a second molar ratio of group V precursors to group III precursors (second V/III ratio), wherein the first and second V/III ratios differ by at least ten percent, and wherein the first semiconductor layer is immediately adjacent to the second semiconductor layer.

2. The method of claim 1, the fabricating further comprising growing a buffer layer directly on the substrate prior to the growing the plurality of semiconductor layers, wherein the first semiconductor layer is grown directly on the buffer layer.

3. The method of claim 2, wherein the growing the buffer layer uses a growth temperature between approximately 500 and approximately 1200 degrees Celsius and a growth rate between approximately 0.01 micrometers and approximately 10 micrometers per hour.

4. The method of claim 1, wherein each epitaxially growing action uses: a group III precursor flow rate between approximately 0.1 and approximately 200 micromoles per minute; a nitrogen precursor flow rate between approximately 100 and 10000 standard cubic centimeters per minute (SCCM); and a pressure between approximately 1 and 760 Torr.

5. The method of claim 1, wherein the epitaxially growing the first semiconductor layer uses: the first V/III ratio between approximately 10 and approximately 1000; a growth temperature between approximately 500 and approximately 1800 degrees Celsius; and a pressure between approximately 1 and 760 Torr.

6. The method of claim 1, wherein the first and second semiconductor layers have a lattice mismatch of at least 0.0001 Angstroms.

7. The method of claim 1, wherein the epitaxially growing the first semiconductor layer and the epitaxially growing the second semiconductor layer use growth rates that differ by at least ten percent.

8. The method of claim 1, wherein the epitaxially growing the first semiconductor layer and the epitaxially growing the second semiconductor layer use substantially the same growth temperature.

9. The method of claim 1, wherein the epitaxially growing the first semiconductor layer and the epitaxially growing the second semiconductor layer use growth temperatures that differ by at least two percent.

10. The method of claim 1, wherein a thickness of each of the first semiconductor layer and the second semiconductor layer is greater than a critical thickness to avoid pseudomorphic growth.

11. The method of claim 1, wherein the first semiconductor layer and the second semiconductor layer are formed of group III nitride materials.

12. The method of claim 1, wherein a composition of the first semiconductor layer and a composition of the second semiconductor layer differ by no more than approximately five percent.

13. The method of claim 1, wherein the growing the plurality of semiconductor layers further includes forming a pattern on a surface of the first semiconductor layer prior to epitaxially growing the second semiconductor layer.

14. A semiconductor structure including:
a substrate; and
a plurality of semiconductor layers epitaxially grown on the substrate, the plurality of semiconductor layers including a set of epitaxial growth periods, each period including:
a first epitaxially grown semiconductor layer, wherein the first epitaxially grown semiconductor layer has a tensile stress; and
a second epitaxially grown semiconductor layer, wherein the second epitaxially grown semiconductor layer has a compressive stress, wherein the first epitaxially grown semiconductor layer and the second epitaxially grown semiconductor layer have molar ratios of group V elements to group III elements that differ by at least ten percent, and wherein the first epitaxially grown semiconductor layer is immediately adjacent to the second epitaxially grown semiconductor layer.

15. The structure of claim 14, further comprising a buffer layer located between the substrate and the plurality of semiconductor layers.

16. The structure of claim 15, wherein the buffer layer has a thickness up to approximately two thousand nanometers.

17. The structure of claim 16, wherein a thickness of the first epitaxially grown semiconductor layer is between approximately one nanometer and five micrometers.

18. The structure of claim 16, wherein the first and second epitaxially grown semiconductor layers layers have a lattice mismatch of at least 0.0001 Angstroms.

19. The structure of claim 14, wherein the first epitaxially grown semiconductor layer and the second epitaxially grown semiconductor layer are formed of group III nitride materials.

20. The structure of claim 14, wherein a composition of the first epitaxially grown semiconductor layer and a composition of the second epitaxially grown semiconductor layer differ by no more than approximately five percent.

21. A method of fabricating a semiconductor structure, the method comprising:
growing a plurality of group III nitride semiconductor layers over a substrate using a set of epitaxial growth periods, wherein each epitaxial growth period includes:
epitaxially growing a first group III nitride semiconductor layer having a tensile stress using a first molar ratio of group V precursors to group III precursors (first V/III ratio); and
epitaxially growing a second group III nitride semiconductor layer having a compressive stress using a second molar ratio of group V precursors to group III precursors (second V/III ratio) different from the first V/III ratio, wherein a thickness of each of the first semiconductor layer and the second semiconductor layer is greater than a critical thickness to avoid pseudomorphic growth, and wherein the first semiconductor layer is immediately adjacent to the second semiconductor layer.

22. The method of claim 21, wherein the first and second V/III ratios differ by at least ten percent.

23. The method of claim 1, wherein the first V/III ratio is less than a V/III ratio for growing the first semiconductor layer without a presence of point defects, and wherein the second V/III ratio is greater than a V/III ratio for growing the second semiconductor layer without stress.

\* \* \* \* \*

UNITED STATES PATENT AND TRADEMARK OFFICE
CERTIFICATE OF CORRECTION

PATENT NO. : 9,831,382 B2  
APPLICATION NO. : 13/692191  
DATED : November 28, 2017  
INVENTOR(S) : Rakesh Jain et al.

Page 1 of 1

It is certified that error appears in the above-identified patent and that said Letters Patent is hereby corrected as shown below:

In the Claims

Column 11, Line 37, "semiconductor layers layers have" should read -- semiconductor layers have --.

Signed and Sealed this
Twenty-third Day of January, 2018

Joseph Matal
*Performing the Functions and Duties of the
Under Secretary of Commerce for Intellectual Property and
Director of the United States Patent and Trademark Office*